United States Patent
Xiao et al.

(10) Patent No.: US 7,713,753 B2
(45) Date of Patent: May 11, 2010

(54) DUAL-LEVEL SELF-ASSEMBLED PATTERNING METHOD AND APPARATUS FABRICATED USING THE METHOD

(75) Inventors: Shuaigang Xiao, Cranberry Township, PA (US); Xiaomin Yang, Sewickley, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 12/203,958

(22) Filed: Sep. 4, 2008

(65) Prior Publication Data

US 2010/0051904 A1    Mar. 4, 2010

(51) Int. Cl.
*H01L 21/00* (2006.01)
(52) U.S. Cl. .................. 438/3; 438/505; 257/E21.09
(58) Field of Classification Search .............. 438/128, 438/3, 505, 706; 257/E21.209, E29.022, 257/E29.168
See application file for complete search history.

(56) References Cited

U.S. PATENT DOCUMENTS

| | | | |
|---|---|---|---|
| 3,969,543 A | 7/1976 | Roberts et al. | |
| 5,240,747 A | 8/1993 | Matsuda et al. | |
| 5,585,020 A | 12/1996 | Becker et al. | |
| 5,652,059 A | 7/1997 | Margel | |
| 5,922,214 A | 7/1999 | Liu et al. | |
| 6,162,532 A | 12/2000 | Black et al. | |
| 6,465,054 B2 | 10/2002 | Effenberger | |
| 6,746,825 B2 | 6/2004 | Nealey et al. | |
| 6,989,324 B2 | 1/2006 | Lee et al. | |
| 7,153,597 B2 | 12/2006 | Yang et al. | |
| 7,347,953 B2 | 3/2008 | Black et al. | |
| 7,410,868 B2 * | 8/2008 | Ufert | 438/257 |
| 7,501,315 B2 * | 3/2009 | Heald et al. | 438/128 |
| 2002/0158342 A1 | 10/2002 | Tuominen et al. | |
| 2004/0203256 A1 | 10/2004 | Yang et al. | |

OTHER PUBLICATIONS

S.-J. Park et al., "Synthesis and Magnetic Studies of Uniform Iron Nanorods and Nanosperes," J. Am. Chem. Soc., vol. 122, 2000, pp. 8581-8582.
Y. Lin et al., "Self-directed self-assembly of nanoparticle/copolymer mixtures", Nature, vol. 434, Mar. 3, 2005, pp. 55-59.

* cited by examiner

*Primary Examiner*—Roy K Potter
(74) *Attorney, Agent, or Firm*—Robert P. Lenart, Esq.; Pietragallo Gordon Alfano Bosick & Raspanti, LLP

(57) ABSTRACT

A method of fabricating a device includes: providing a substrate having a patterned surface, depositing a first-level self-assembled material on at least a portion of the patterned surface, wherein the position and/or orientation of the first-level self-assembled material is directed by the patterned surface, to form a first nanostructure pattern, and depositing a second-level self-assembled material on at least a portion of the first nanostructure pattern to form an array of nanostructures of the second-level self-assembled material. An apparatus fabricated using the method is also provided.

15 Claims, 4 Drawing Sheets

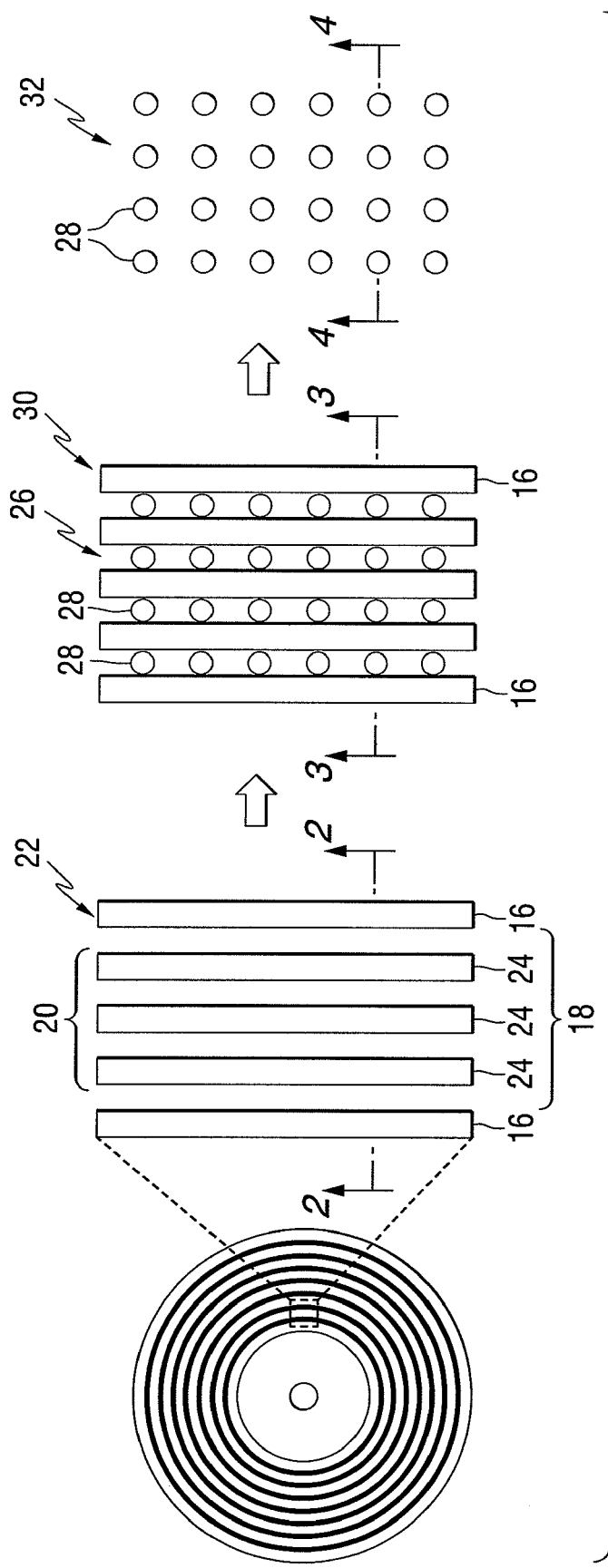
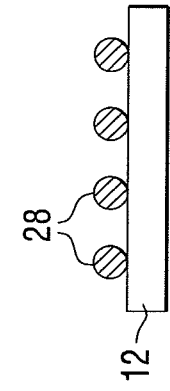
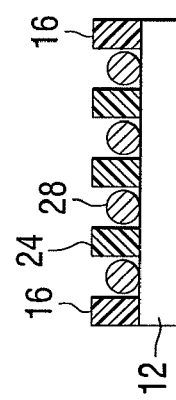
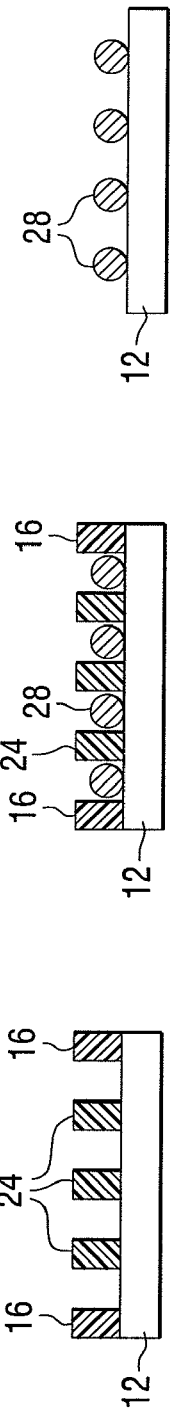

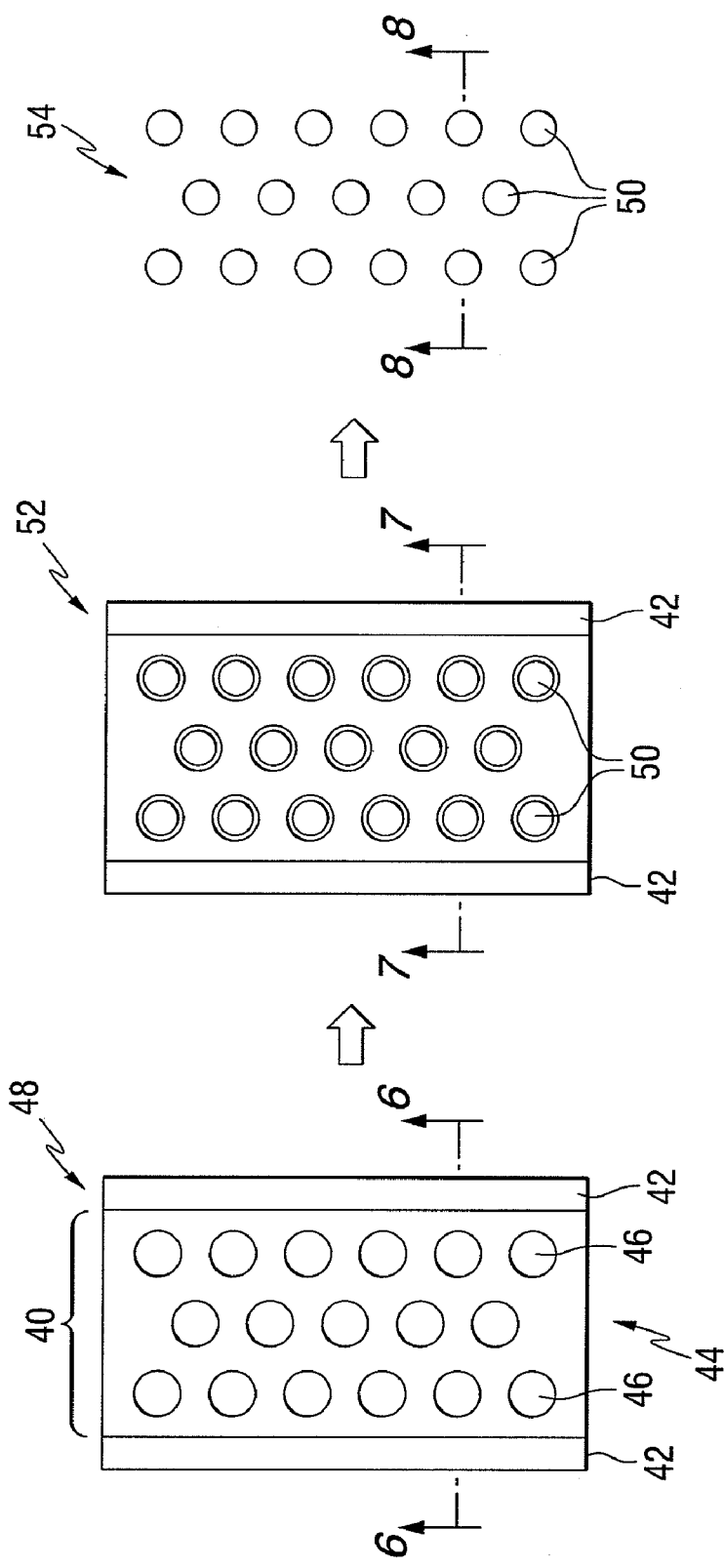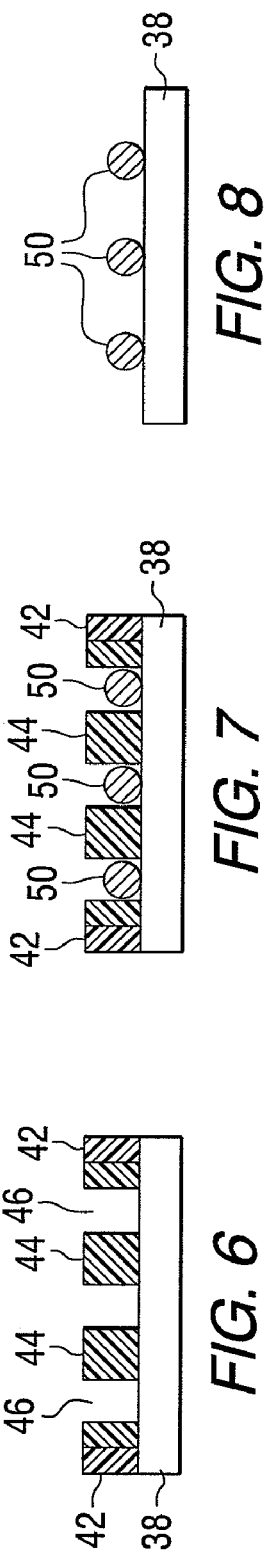

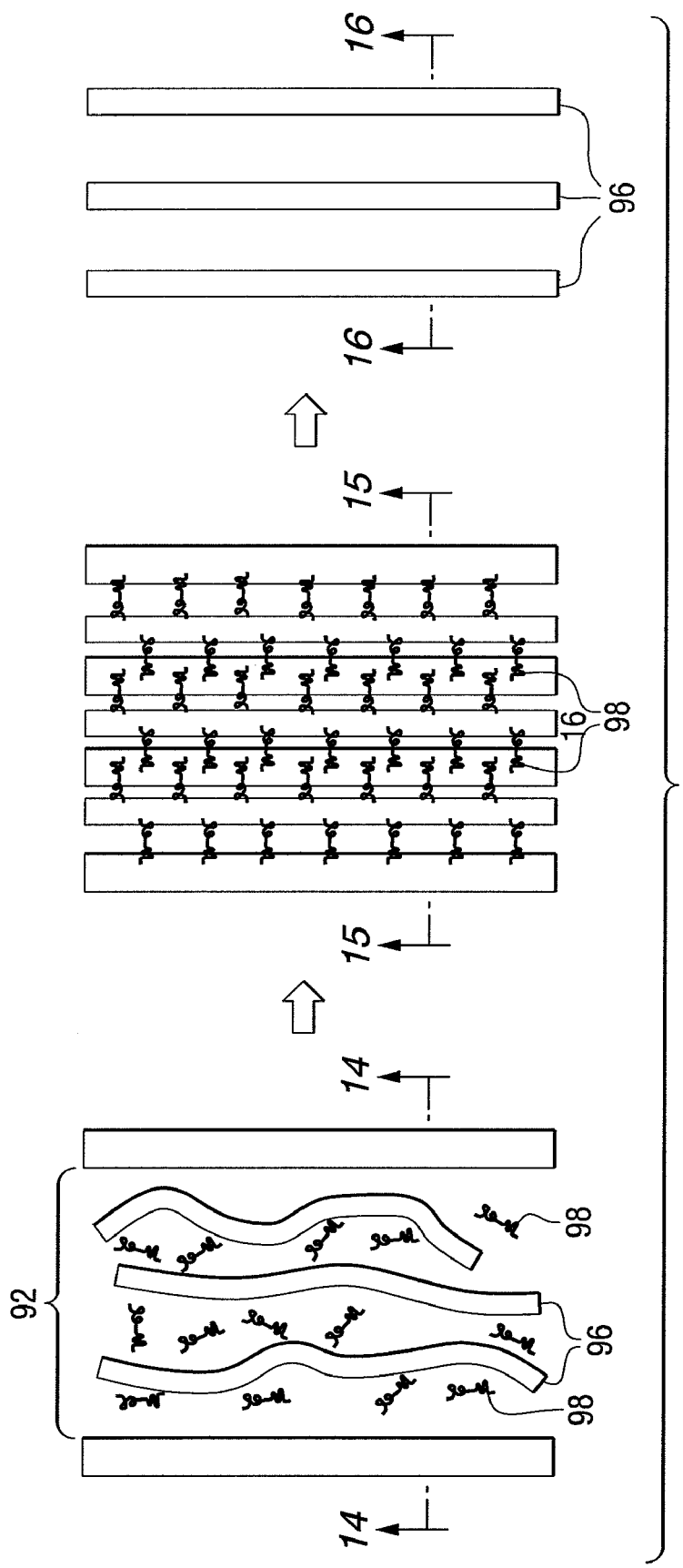
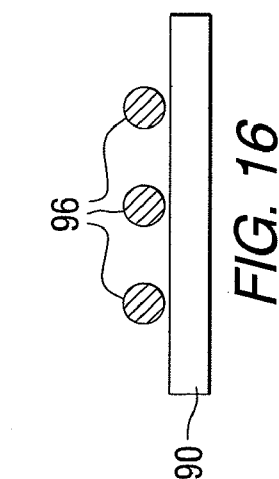
FIG. 16
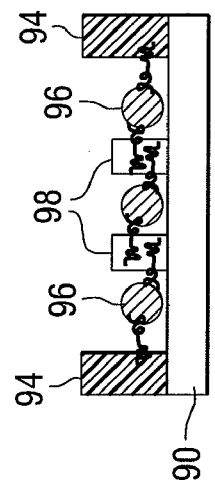
FIG. 15
FIG. 13
FIG. 14

DUAL-LEVEL SELF-ASSEMBLED PATTERNING METHOD AND APPARATUS FABRICATED USING THE METHOD

BACKGROUND

This invention relates to methods of fabricating nanostructured devices and to devices fabricated using such methods.

Structures having components with dimensions on a nanometer scale are being considered for use in the areas of optics, electronics, mechanics, magnetism and so forth. Nanostructured materials differ from corresponding bulk materials and single atoms. Nanostructures encompass various structures referred to as, for example, nanoparticles, nanotubes or quantum dots, and may potentially be used as building blocks for ordered and complex materials. The fabrication of nanostructures on substrates for application in devices, however, remains as a major challenge.

Many practical applications of devices in photo-electronic, electronic, sensor, storage and display technologies require the two-dimensional or three-dimensional patterning of nanostructured materials on surfaces, in one layer or in several layer thin films.

Nanostructures having dimensions of less than, for example 10 nm are desirable for bit-patterned magnetic storage media. However, since optical lithography is limited by the diffraction limit, the resolution of conventional optical lithography is usually limited to about 50 nm half-pitch. Thus conventional optical lithography is not suitable for fabricating such nanostructures for bit-patterned magnetic storage media.

SUMMARY

In one aspect, the invention provides a method of fabricating a device including: providing a substrate having a patterned surface, depositing a first-level self-assembled material on at least a portion of the patterned surface, wherein the position and/or orientation of the first-level self-assembled material is directed by the patterned surface, to form a first nanostructure pattern, and depositing a second-level self-assembled material on at least a portion of the first nanostructure pattern to form an array of nanostructures of the second-level self-assembled material.

In another aspect, the invention provides an apparatus including a substrate having a patterned surface, a first-level self-assembled material on at least a portion of the patterned surface, wherein the position and/or orientation of the first-level self-assembled material is directed by the patterned surface, to form a first nanostructure pattern, and a second-level self-assembled material arranged in an array of nanostructures on at least a portion of the first nanostructure pattern.

In another aspect, the invention provides a method of fabricating a device including: providing a substrate having a patterned surface, depositing a mixture of nanoparticles and a block copolymer on the patterned surface, phase separating the mixture, and removing the block copolymer.

BRIEF DESCRIPTION OF THE DRAWINGS

FIG. 1 is a schematic representation of a fabrication process in accordance with one aspect of the invention.

FIG. 2 is a cross-sectional view of one of the structures in FIG. 1.

FIG. 3 is a cross-sectional view of one of the structures in FIG. 1.

FIG. 4 is a cross-sectional view of one of the structures in FIG. 1.

FIG. 5 is a schematic representation of structures in a fabrication process in accordance with another aspect of the invention.

FIG. 6 is a cross-sectional view of one of the structures in FIG. 5.

FIG. 7 is a cross-sectional view of one of the structures in FIG. 5.

FIG. 8 is a cross-sectional view of one of the structures in FIG. 5.

FIG. 13 is a schematic representation of structures in a fabrication process in accordance with another aspect of the invention.

FIG. 14 is a cross-sectional view of one of the structures in FIG. 13.

FIG. 15 is a cross-sectional view of one of the structures in FIG. 13.

FIG. 16 is a cross-sectional view of one of the structures in FIG. 13.

DETAILED DESCRIPTION OF THE INVENTION

Figures 9, 10, 11, 12:
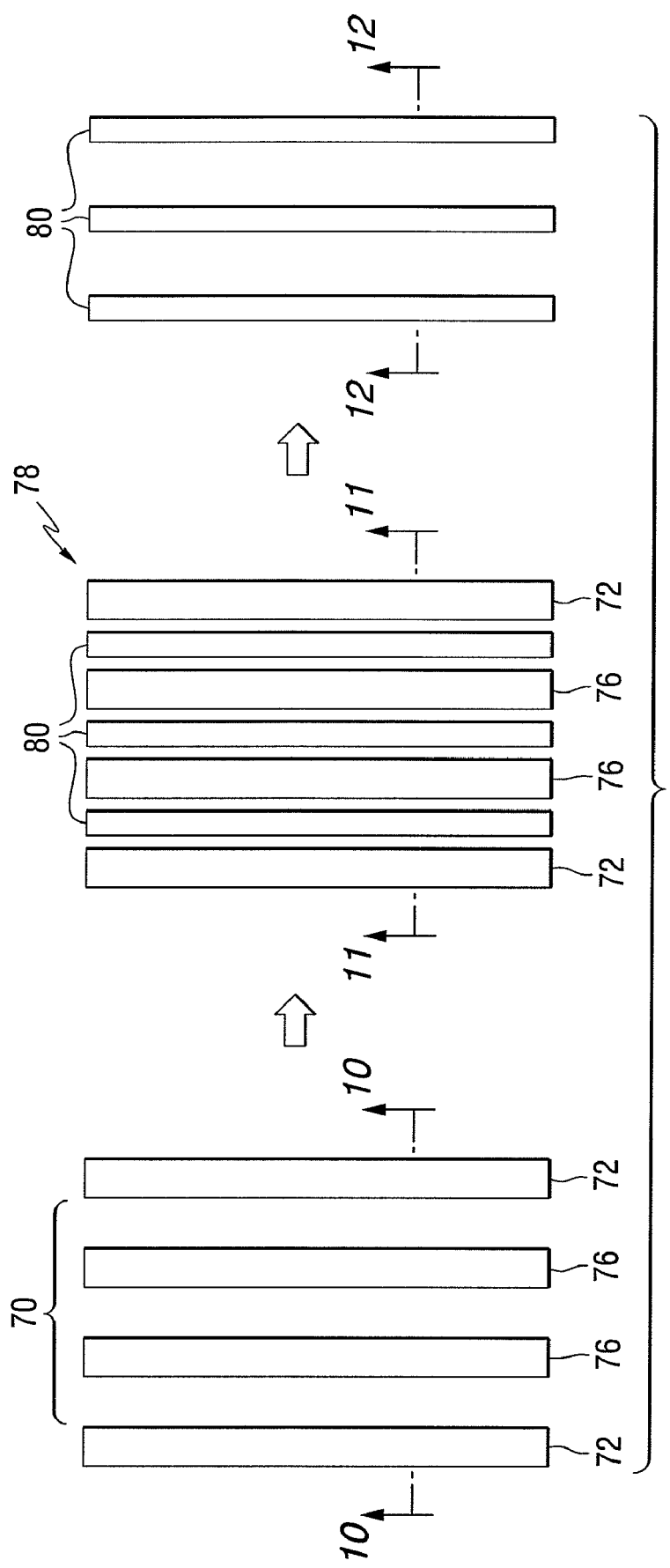
FIG. 9 is a schematic representation of structures in a fabrication process in accordance with another aspect of the invention.
FIG. 10 is a cross-sectional view of one of the structures in FIG. 9.
FIG. 11 is a cross-sectional view of one of the structures in FIG. 9.
FIG. 12 is a cross-sectional view of one of the structures in FIG. 9.

A high-throughput patterning method is desired for forming nanostructures on a substrate. In one aspect, the invention uses a substrate structure with a surface pattern of trenches and islands that can be used to direct the self-assembly, or self-organization, of an array of nanostructures in the trenches. The trenches and islands of the substrate structure may have relatively large scale dimensions, and can be formed with a slightly larger pitch than the nanostructure array.

Block copolymer nanostructures can be used to form structures having half-pitch domain sizes in the order of about 5 nm to about 50 nm. However, these block copolymer nanostructures usually lack long-range order. In one aspect, this invention addresses the poor long-range order issue by using a substrate having a surface pattern with either topographic contrast or chemical contrast to promote long-range order in block copolymer nanostructures. In one example, the substrate pattern can be created by optical lithography. A substrate having a chemical contrast surface can include alternating hydrophobic/hydrophilic regions or alternating polar/non-polar regions having distinct affinity to distinct blocks in the copolymer, while the topographic difference between the two regions is negligible compared with the characteristic length in the block copolymer system (i.e., domain size).

In one example, a fine periodic structure can be created within the substrate trenches using block copolymers to form a very fine grating with a half-pitch in the order of about 5 nm to about 10 nm, which is comparable to general nanoparticle diameters. The block copolymer structure can be confined in the trenches of the substrate structure to form well-ordered line/grating patterns. Then the line/grating patterns can be used to guide the self-assembly (also called self-organization) of nanoparticles, which are subsequently deposited in the line/grating patterns. Such nanoparticles typically have little long/short-range order due to the lack of intrinsic ordering mechanism. However, the line/grating patterns of the structure in the trenches promotes self-assembly of the nanoparticles.

As used in this description, self-assembly means the formation of periodic nanostructures of self-assembling materials, such as block copolymers and nanoparticles. The periodic nanostructures form spontaneously in a relatively large area according to thermodynamic properties. This is in contrast to a top-down approach utilizing a photomask and an exposure beam source such as a 248 nm stepper, 193 nm scanner, extreme-ultraviolet, or electron-beam. There is no fundamental limit of the block copolymer grating pattern resolution, which is dependent on the copolymer molecules.

Referring to the drawings, FIG. 1 schematically illustrates a fabrication process in accordance with one aspect of the invention. FIG. 2 is a cross-sectional view of one of the structures in FIG. 1, taken along line 2-2. FIG. 3 is a cross-sectional view of one of the structures in FIG. 1, taken along line 3-3. FIG. 4 is a cross-sectional view of one of the structures in FIG. 1, taken along line 4-4.

In the example of FIGS. 1-4, a disc 10 includes a substrate 12 and has a surface pattern 14 formed on the substrate, wherein the surface pattern includes a plurality of concentric grooves 16 separated by lands 18. While only a few grooves are shown in FIG. 1 for clarity, it will be appreciated that many more grooves may be used in a practical device. The grooves and lands of the surface pattern serve to direct the position and/or orientation of subsequently formed nanostructures. The grooves can be created by conventional lithography, such as optical lithography, e-beam lithography, nanoimprinting, etc. The half-pitch of the surface pattern 14 can be, for example, tens to hundreds of nanometers. In this example, the grooves have a substantially rectangular cross-sectional shape in a radial direction, with sidewalls of the grooves being substantially perpendicular to the plane of the substrate.

A first-level self-assembled material is used to fabricate a pattern 20, whose long-range order and positional accuracy is directed by surface pattern 14. The pattern 20 is formed in the grooves to produce a first intermediate structure 22. In one example, the first-level self-assembled pattern is fabricated using block copolymers. The block copolymer self-assembled pattern can be, for example, a line/grating pattern, a hexagonally arranged perpendicularly oriented cylinder pattern, or a hexagonally arranged monolayered sphere pattern. In the example of FIGS. 1-4, a line/grating pattern is shown.

To form the line pattern, a block copolymer can be deposited in the trenches via spin-coating from a dilute solution in general solvents like toluene, forming perpendicularly oriented lamellae, and one domain of the block copolymer can be removed, using one of several known techniques, to leave lines 24 of a first self-assembled material. The block copolymer pattern with alternating lines and spaces can be comprised of perpendicularly oriented lamellae or lying-down cylinders. To assist in forming the perpendicularly oriented lamellae, the substrate can be pretreated (e.g., with organosilanes or polymer brushes) to provide equal surface energy for the two blocks in the copolymer.

The block copolymer can include two organic blocks (e.g., polystyrene-block-polymethylmethacrylate) or one organic block, one inorganic block (e.g., polystyrene-block-polydimethylsiloxane). One of the domains can be removed by UV degradation followed by a wet rinse. For example, upon UV exposure, polymethylmethacrylate is degraded while polystyrene is cross-linked. In another example, oxygen plasma can be used to remove organic components. Polydimethylsiloxane has good resistance to oxygen plasma.

A second-level self-assembled material is then deposited on the first-level self-assembled material to form a pattern 26 of nanostructures 28 in a second intermediate structure 30. The position and/or orientation of the nanostructures 28 is directed by the first-level self-assembled pattern. The second-level self-assembled pattern of nanostructures 28 can be formed of, for example, nanoparticles or nanowires, both of which are functional nanostructures useful for bit-patterned magnetic recording media, discrete track magnetic recording media, flash memory, semiconductor nanodevices, etc.

The remaining block copolymer lines can be removed to leave the nanostructures 28 in the structure 32. The remaining block copolymer lines can be removed by oxygen plasma (e.g., for organic copolymer blocks) or fluorine-based plasma (e.g., for Si-containing copolymer blocks). The lands 16 in FIG. 3 can be removed to leave the pattern of nanostructures 28 on the substrate. If, for example, the lands are silicon-based, they can be removed by fluorine-based plasma.

In the example of FIGS. 1-4, the nanostructures 28 are positioned in the first-level self-assembled pattern of a well-defined block copolymer with one domain already removed. In this case, the precise separation of nanoparticles in individual block copolymer trenches is due to physical size matching and/or chemical affinity between nanoparticles and the unremoved copolymer blocks. In the latter case, the nanoparticle may need a surface chemical treatment to guarantee the chemical affinity. The separation of nanoparticles in the cross-track direction, normal to the line pattern formed by block copolymers, is guaranteed by the isolation of block copolymer lines, while the separation of nanoparticles in the down-track direction is controlled by inter-particle repulsion interaction.

FIGS. 5-8 illustrate the formation of a nanoparticle array in accordance with another aspect of the invention. The structures of FIGS. 5-8 can be formed on a substrate 38 having a surface pattern that includes trenches 40 between lands 42, similar to the initial structure shown in FIG. 1. In this example, the first-level self-assembled material comprises a block copolymer used to fabricate a pattern 44 by depositing the block copolymer in the trenches. Removing one component in perpendicularly oriented cylinder-forming block copolymer structures can leave a nanoporous structure. In this case, the substrate can be pretreated (e.g., with organosilanes or polymer brushes) to provide equal surface energy to the two blocks in the copolymer. FIGS. 5-8 show an example wherein removing one of the domains forms cylindrical openings 46 as shown in intermediate structure 48.

The block copolymer can include two organic blocks (e.g., polystyrene-block-polymethylmethacrylate) or one organic block, one inorganic block (e.g., polystyrene-block-polydimethylsiloxane). One of the domains can be removed by UV degradation followed by a wet rinse. For example, upon UV exposure, polymethylmethacrylate is degraded while polystyrene is cross-linked. In another example, oxygen plasma can be used to remove organic components. Polydimethylsiloxane has good resistance to oxygen plasma.

The second-level self-assembled material is deposited in the openings of the first-level self-assembled pattern to form nanostructures 50 in an intermediate structure 52. Then the first-level self-assembled pattern is removed, for example, by oxygen plasma (e.g., for organic copolymer blocks) or fluorine-based plasma (e.g., for Si-containing copolymer blocks). The lands 42 in FIG. 7 can be removed to leave the pattern of nanostructures 50 on the substrate. If, for example, the lands are silicon-based, they can be removed by fluorine-based plasma.

In the example of FIGS. 5-8, the nanoparticles of the second-level self-assembled material are added into well-defined block copolymer patterns with one domain already removed. In that case, the precise separation of nanoparticles into individual block copolymer nanopores is due to physical size matching and/or chemical affinity between nanoparticles and the unremoved copolymer blocks. In the latter case, the nanoparticle may need surface chemical treatment to guarantee the chemical affinity. The size of nanoparticles is comparable to the size of nanopores in the block copolymer patterns. These features result in only one nanoparticle in each nanopore.

FIGS. 9-12 illustrate the formation of a nanowire array in accordance with another aspect of the invention. The structures of FIGS. 9-12 can be formed on a substrate 68 having a surface pattern that includes trenches 70 between lands 72, similar to the initial structure shown in FIG. 1. In this example, the first-level self-assembled material comprises a block copolymer forming a stripe pattern 74 having either perpendicularly oriented lamellae or lying-down cylinders 76. In the case of perpendicularly oriented lamellae, the substrate can be pretreated (e.g., with organosilanes or polymer brushes) to provide equal surface energy to the two blocks in the copolymer.

The block copolymer can include two organic blocks (e.g., polystyrene-block-polymethylmethacrylate) or one organic block, one inorganic block (e.g., polystyrene-block-polydimethylsiloxane). One of the domains can be removed by UV degradation followed by a wet rinse. For example, upon UV exposure, polymethylmethacrylate is degraded while polystyrene is cross-linked. In another example, oxygen plasma can be used to remove organic components. Polydimethylsiloxane has good resistance to oxygen plasma.

The second-level self-assembled material forms a pattern 78 of nanostructures 80 on the first-level self-assembled pattern. Then the first-level self-assembled pattern is removed, for example, by oxygen plasma (for organic copolymer blocks) or fluorine-based plasma (for Si-containing copolymer blocks), leaving an array of nanostructures 80.

In the example of FIGS. 9-12, nanowires are formed in well-defined block copolymer patterns with one domain already removed. In that case, the precise separation of nanowires in individual block copolymer trenches is mainly due to physical size matching and/or chemical affinity between nanoparticles and the unremoved copolymer blocks. In the latter case, the nanoparticle may need surface chemical treatment to guarantee the chemical affinity.

In another example, the first-level self-assembled pattern can be a block copolymer pattern, which can be formed without removing one block copolymer component.

In another aspect of the invention, nanoparticles can be mixed with block copolymer micelle solutions first, then the mixed system can be induced to phase separate. FIGS. 13-16 illustrate the formation of a nanowire array in accordance with this aspect of the invention. The structures of FIGS. 13-16 can be formed on a substrate 90 having a surface pattern that includes trenches 92 between lands 94, similar to the initial structure shown in FIG. 1. In this example, nanowires 96 are mixed with a block copolymer 98 in a micelle solution. Then the mixed system can be induced to phase separate to form the structure 100 of FIG. 15 using various methods, such as thermal annealing or solvent annealing, to achieve thermodynamically stable or metastable structures. Next, the copolymer is removed to leave an array of nanowires 96 on the substrate as shown in FIG. 16.

In the example of FIGS. 13-16, the precise separation of nanoparticles into individual block copolymer domains is not only due to physical size matching but also due to chemical affinity. The nanoparticles may need chemical surface modification by organic small molecules with end group similar to one block in the block copolymer. In the described examples, a block copolymer nanoporous/nanodotted pattern can be formed by either perpendicularly oriented cylinders or monolayered spheres, and a block copolymer line pattern can be formed by either perpendicularly oriented lamellae or lying-down cylinders.

A surface pretreatment of the nanoparticles/nanowires is used to enable ideal mixing of block copolymers and nanoparticles/nanowires whose surfaces have been treated to chemically favor one block in the copolymer.

Various materials can be used for the block copolymers and nanoparticles/nanowires. Although there are only two block copolymer materials typically described as above, almost all di-block copolymers having two chemically distinct components/blocks are applicable).

In addition, various materials can be used for the nanoparticles. In one example, the nanoparticles can be 3-Aminopropyl-(3-oxobutanoic acid) functionalized silica nanoparticle dispersion, having a particle size of about 15 nm, at 2.5% (w/v) in dimethylformamide (DMF). In another example, the nanoparticles can be magnetic materials, such as iron oxide nanoparticles having a particle size of 6.5 nm±3.0 nm, (e.g., Fe-Oxide-Nucleus). In another example, the nanoparticles can be decanethiol functionalized silver nanoparticles having a particle size of about 1 nm to about 10 nm, in a solution of 0.1% (w/v) in hexane.

In another example, the nanoparticles can be 2% (w/v) 1-Mercapto-(triethylene glycol) methyl ether functionalized gold nanoparticles in a solution of 200 proof ethanol.

The invention is not limited to block copolymer/nanoparticle binary systems. It can also be applied to any multi-level self-assembly system with different levels of patterning capability. The first-level, relatively large scale, self-assembly patterning can be performed on a patterned substrate that can be fabricated using conventional lithography. The second-level, relatively small scale, self-assembly patterning can be performed with the assistance of the first-level patterning.

In the described examples, good short-range order in first-level self-assembly system (e.g., a block copolymer) is achieved by block-to-block connectivity and thermodynamics, while long-range order is improved by using a substrate surface pattern created by conventional lithography. The block copolymer domain size can be in the order of about 5 nm to about 50 nm. The second-level self-assembly system (e.g., nanoparticles or nanowires), does not inherently have good long/short-range order due to the lack of an intrinsic ordering mechanism. However, long-range order in the second-level self-assembly system and its registration to the substrate is directed by the first-level self-assembled system. The domain size of the second-level self-assembly system can be in the order of about 1 nm to about 50 nm (at least in one direction in the case of nanowires).

In another aspect, this invention provides apparatus fabricated using one of the described methods.

In yet another aspect, the invention provides an apparatus including a substrate having a patterned surface, a first-level self-assembled material on at least a portion of the patterned surface, forming a nanostructure pattern, and a second-level self-assembled material on at least a portion of the nanostructure pattern, forming an array of nanostructures of the second-level self-assembled material. The first-level self-assembled material can include at least one domain of a block copolymer. The second-level self-assembled material can include one nanostructure within each domain of the block copolymer. The nanostructure can be, for example, nanoparticles or nanowires.

In data storage applications, magnetic nanoparticles may be useful in bit-patterned media (BPM). It is desirable that such magnetic nanoparticles be arranged in a substantially ordered array. In one aspect, this invention relates to a method for providing long-range order of nanoparticles for the fabrication of BPM.

While the invention has been described in terms of several examples, it will be apparent to those skilled in the art that various changes can be made to the disclosed examples without departing from the scope of the invention as defined by the following claims. The implementations described above and other implementations are within the scope of the claims.

What is claimed is:

1. A method of fabricating a device comprising:
   providing a substrate having a patterned surface;
   depositing a first-level block copolymer self-assembled material on at least a portion of the patterned surface, wherein the position and/or orientation of the first-level self-assembled material is directed by the patterned surface, to form a first nanostructure pattern; and
   depositing a second-level self-assembled material on at least a portion of the first nanostructure pattern to form an array of nanostructures of the second-level self-assembled material.

2. The method of claim 1, further comprising:
   removing one domain of the block copolymer to form the first nanostructure pattern as a grating pattern.

3. The method of claim 2, wherein the grating pattern has a half-pitch of about 5 nm to about 10 nm.

4. The method of claim 1, further comprising:
   removing one domain of the block copolymer to form the first nanostructure pattern having a plurality of cylindrical openings.

5. A method of fabricating a device comprising:
   providing a substrate having a patterned surface;
   depositing a first-level self-assembled material on at least a portion of the patterned surface, wherein the position and/or orientation of the first-level self-assembled material is directed by the patterned surface, to form a first nanostructure pattern: and
   depositing a second-level self-assembled material on at least a portion of the first nanostrueture pattern to form an array of nanostructures of the second-level self-assembled material wherein the patterned surface comprises:
   a plurality of grooves separated by a plurality of lands arranged in the patterned surface with a half-pitch of about 5 nm to about 50 nm.

6. A method of fabricating a device comprising:
   providing a substrate having a patterned surface;
   depositing a first-level self-assembled material on at least a portion of the patterned surface, wherein the position and/or orientation of the first-level self-assembled material is directed by the patterned surface, to form a first nanostructure pattern; and
   depositing a second-level self-assembled material on at least a portion of the first nanostructure pattern to form an array of nanostructures of the second-level self-assembled material wherein the second-level self-assembled material comprises a magnetic material.

7. A method of fabricating a device comprising:
   providing a substrate having a patterned surface;
   depositing a first-level self-assembled material on at least a portion of the patterned surface, wherein the position and/or orientation of the first-level self-assembled material is directed by the patterned surface, to form a first nanostructure pattern; and
   depositing a second-level self-assembled material on at least a portion of the first nanostructure pattern to form an array of nanostructures of the second-level self-assembled material wherein the patterned surface comprises:
   a chemical contrast surface including alternating hydrophobic/hydrophilic regions or alternating polar/non-polar regions.

8. An apparatus comprising:
   a substrate having a patterned surface;
   a first-level self-assembled material on at least a portion of the patterned surface, wherein the position and/or orientation of the first-level self-assembled material is directed by the patterned surface, to form a first nanostructure pattern; and
   a second-level self-assembled material arranged in an array of nanostructures on at least a portion of the first nanostructure pattern, wherein the first nanostructure pattern comprises a grating pattern formed by removing a domain of a block copolymer.

9. The apparatus of claim 8, wherein the grating pattern has a half-pitch of about 5 nm to about 10 nm.

10. An apparatus comprising:
    a substrate having a patterned surface;
    a first-level self-assembled material on at least a portion of the patterned surface, wherein the position and/or orientation of the first-level self-assembled material is directed by the patterned surface, to form a first nanostructure pattern; and
    a second-level self-assembled material arranged in an array of nanostructures on at least a portion of the first nanostructure pattern, wherein the first nanostructure pattern includes a plurality of cylindrical openings.

11. An apparatus comprising:
    a substrate having a patterned surface;
    a first-level self-assembled material on at least a portion of the patterned surface, wherein the position and/or orientation of the first-level self-assembled material is directed by the patterned surface, to form a first nanostructure pattern; and
    a second-level self-assembled material arranged in an array of nanostructures on at least a portion of the first nanostructure pattern, wherein the patterned surface comprises a plurality of grooves separated by a plurality of lands arranged in the patterned surface with a half-pitch of about 5 nm to about 50 nm.

12. An apparatus comprising:
    a substrate having a patterned surface;
    a first-level self-assembled material on at least a portion of the patterned surface, wherein the position and/or orientation of the first-level self-assembled material is directed by the patterned surface, to form a first nanostructure pattern; and
    a second-level self-assembled material arranged in an array of nanostructures on at least a portion of the first nanostructure pattern, wherein the second-level self-assembled material comprises a magnetic material.

13. An apparatus comprising:
    a substrate having a patterned surface;
    a first-level self-assembled material on at least a portion of the patterned surface, wherein the position and/or orientation of the first-level self-assembled material is directed by the patterned surface, to form a first nanostructure pattern; and a second-level self-assembled material arranged in an array of nanostructures on at least a portion of the first nanostructure pattern, wherein the patterned surface comprises:

a chemical contrast surface including alternating hydrophobic/hydrophilic regions or alternating polar/non-polar regions.

14. A method of fabricating a device comprising:

providing a substrate having a patterned surface;

depositing a mixture of nanoparticles and a block copolymer on the patterned surface;

phase separating the mixture; and removing the block copolymer, wherein the step of phase separating the mixture comprises:

thermal annealing or solvent annealing.

15. A method of fabricating a device comprising:

providing a substrate having a patterned surface depositing a mixture of nanoparticles and a block copolymer on the patterned surface;

phase separating the mixture; and removing the block copolymer, wherein the patterned surface comprises:

a plurality of grooves separated by a plurality of lands.

* * * * *